United States Patent [19]

Anderson

[11] 4,108,683
[45] Aug. 22, 1978

[54] METHOD FOR AUTOMATICALLY PROCESSING PHOTOGRAVURE CURVILINEAR SURFACES

[76] Inventor: James K. Anderson, 1110 Rostrevor, Louisville, Ky. 40205

[21] Appl. No.: 722,015

[22] Filed: Sep. 10, 1976

Related U.S. Application Data

[63] Continuation-in-part of Ser. No. 577,898, May 15, 1975, which is a continuation of Ser. No. 392,475, Aug. 29, 1973, abandoned.

[51] Int. Cl.² .............................................. B41C 1/18
[52] U.S. Cl. ........................................ 134/27; 134/28; 134/33; 156/641; 156/905
[58] Field of Search ................... 156/14, 18, 345, 641, 156/DIG. 905, 659; 134/73, 27, 28, 117, 57, 33

[56] References Cited

U.S. PATENT DOCUMENTS

| 3,092,123 | 6/1963 | Harris | 134/117 |
| 3,323,528 | 6/1967 | Link | 134/57 |
| 3,869,313 | 3/1975 | Jones et al. | 156/345 |
| 3,967,632 | 7/1976 | Herrman et al. | 156/345 |

*Primary Examiner*—William A. Powell
*Assistant Examiner*—Jerome W. Massie

[57] ABSTRACT

A method for automatically processing photogravure images onto curvilinear surfaces including automated conveying means, etching means, etch terminating means, staging material removing means, and etching resist removing means.

6 Claims, 6 Drawing Figures

METHOD FOR AUTOMATICALLY PROCESSING PHOTOGRAVURE CURVILINEAR SURFACES

CROSS REFERENCE TO RELATED APPLICATION

This application is a continuation-in-part of U.S. application Ser. No. 577,898, filed May 15, 1975 which was a continuation of application Ser. No. 392,475, filed Aug. 29, 1973, which is now abandoned.

BACKGROUND OF THE INVENTION

This invention relates to a method for preparing photogravure images on a printing surface by automatically performing functions previously requiring manual operations and more particularly relates to the reduction of water pollution by the separation of required processing materials and recycling same in the process of preparing photogravure images.

It has heretofore been common practice to perform several of the required operations in separate work stations in the preparation of photogravure images. Some of the required operations have required an operator normally stationed at each station to perform the required manual functions and to assist in the movement of the cylinders from station to station. Furthermore, at selected work stations it has been necessary to combine a plurality of different materials in order to perform a preselected operation. In so doing, it has become difficult to avoid contaminating each of these materials, which prevents further use and accurate control of the selected materials as well as considerable waste of these materials.

SUMMARY OF THE INVENTION

The present invention advantageously provides a straightforward arrangement for a method for automatically procuring, etching, etch terminating, cleaning, and moving curved surfaces or cylinders to be engraved for use in the rotogravure printing process.

Various other features of the present invention will become obvious to those skilled in the art upon reading the disclosure set forth hereinafter.

More particularly, the present invention provides a method for processing photogravure curvilinear surfaces comprising the steps of: placing a first photogravure curvilinear surface onto an etching station; rotating said first surface and simultaneously therewith spraying an etching solution thereon for a preselected period of time; removing said first surface from said etching station, then placing said first surface onto an etch terminating station; rotating said first surface and simultaneously therewith spraying an etch terminating solution thereon for a preselected period of time; and, removing said first surface from said etch terminating station, the time of residence of said surface at each of said stations being generally the same, thereby prompting the sequential continuous movement of surfaces from station to station.

It is to be understood that the description in the examples of the present invention given hereinafter are not by way of limitation. Various modifications within the scope of the present invention will occur to those skilled in the art upon reading the disclosure set forth hereinafter.

Referring to the drawing.

Figure 1:
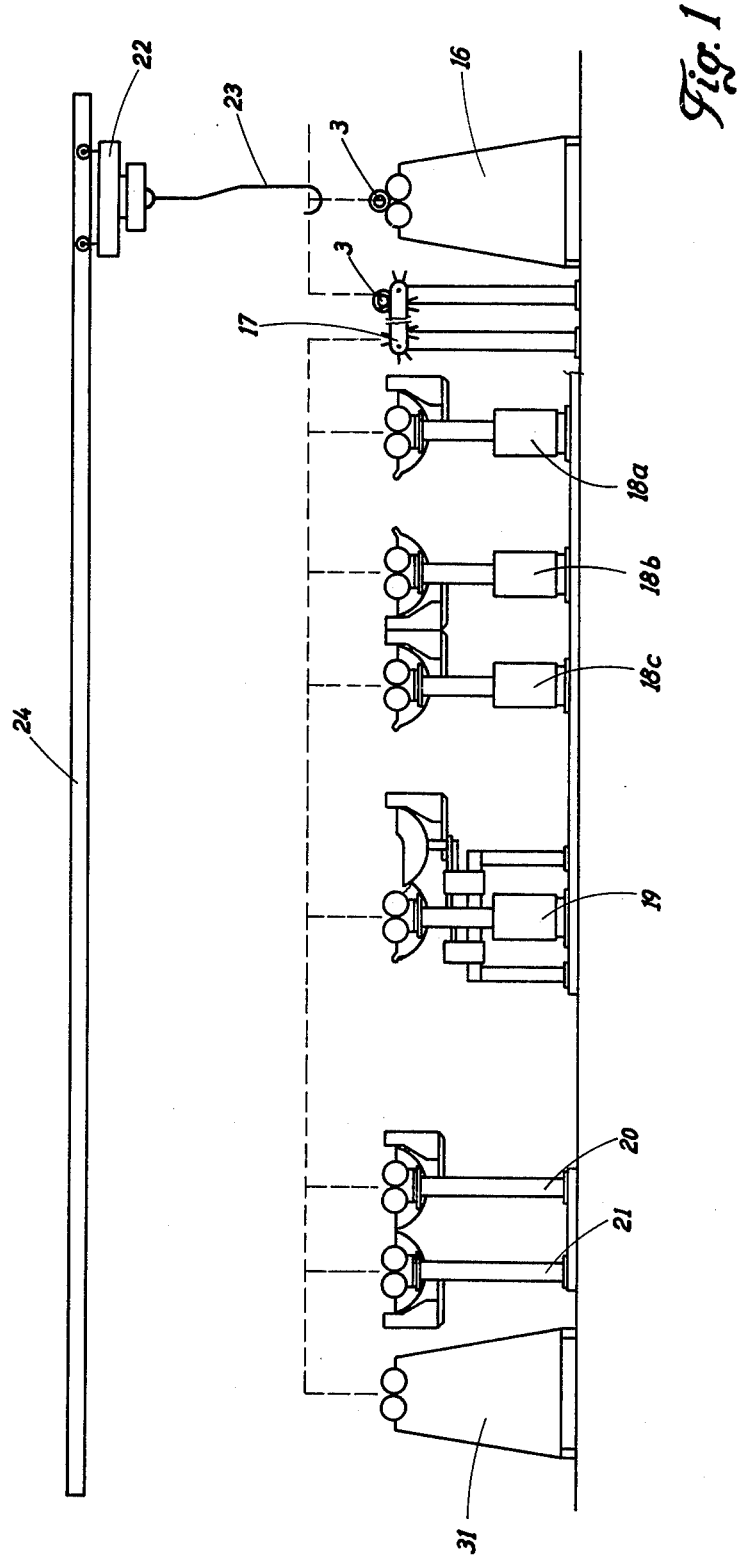
FIG. 1 is a flow-scheme illustrating the various work stations involved in one preferred method of the present invention.

Referring to FIG. 1 of the drawing in carrying out the present invention, an overhead conveying means is provided which includes a hoist 22 with a vertically downward extending gravure curvilinear surface member receiving means 23 mounted thereto. Hoist 22 is in communication with overhead tracks 24 and is adapted for horizontal movement thereon. The vertically downward extending curvilinear surface member receiving means 23 is adapted for vertical movement and includes means for engaging a gravure curvilinear surface member, such as cylinder 3. A more detailed description of the overhead conveying means will be discussed hereinafter.

The present invention, as shown in FIG. 1, further includes a plurality of automated work stations, each station being adapted to receive a gravure cylinder 3 or a curvilinear plate for a preselected period of time at preselected operating conditions and thereby process the gravure cylinder in accordance with the preselected operating conditions. The first station or rack is a storage rack 16, storage rack 16 being provided for receiving a cylinder 3 for holding until a preselected time before a cylinder 3 is moved to a holding station 17 by the hoist 22 and curvilinear surface member or cylinder receiving means 23. It is realized that storage rack 16 may be, for example, a truck stationarily positioned with a plurality of cylinders 3 thereon.

A holding station 17 is provided for putting a plurality of cylinders 3 in an etching process line at a rate so that the movement of cylinders from one etch station, to be discussed hereinafter, to another etch station can be accomplished without delay. The station 17 contains a plurality of holding positions in series so that a cylinder 3 in the processing line is received by each of the positions sequentially. A more detailed description of a station 17 will be discussed hereinafter.

A plurality of etching stations, in series, three being illustrated in the present example, identifiable as 18a, b, and c are provided for receiving cylinders 3. Each of the etching stations 18a, b, and c are adapted for etching the under-exposed portion of the gravure cylinder under predetermined operating conditions for a preselected period of time. The operating conditions of each of the stations 18a, b, and c will generally vary as to concentration of etching solution, and the like, but the preselected period of time to which a cylinder is subjected to the varying operation conditions is generally the same so that movement of the cylinder 3 from one station 18 to the next station 18 will be accomplished at a uniform rate. Furthermore, the preselected period of time for the holding of a cylinder 3 in a station 18 is generally the same as for a holding position in station 17. A more detailed description of the stations 18a, b, and c will be discussed hereinafter.

An etch terminating station 19 is provided for receiving cylinders 3 and terminating the etch of the cylinder 3 which was performed in the etching stations 18. The operating conditions for station 19 will be discussed hereinafter.

A plurality of cleaning stations in series, two being illustrated in the present example, identifiable as 20 and 21, are provided for receiving cylinders 3, removing the staging material and the photo-resist from the cylinders 3. The operating conditions for each of the stations 20 and 21 will generally vary, but the preselected period of time to which the cylinder is subjected to the selected operation conditions is generally the same. A more detailed description of the stations 20 and 21 will be discussed hereinafter.

A truck 31 is provided for receiving the processed cylinders 3 from the cleaning station 21 and transporting the cylinders 3 to the printing operations. Truck 31 may be of any standard design and may be capable of handling any number of cylinders 3. It is also realized that other transporting systems may be utilized such as a monorail or other conveying means.

The overhead conveying means of the present invention including the hoist 22, the vertically downwardly extending cylinder receiving means 23, and a tract 24 upon which the hoist 22 moves horizontally, is provided for moving the cylinders 3 from the storage rack 16 to the holding station 17. The conveying means is further adaptable for moving the cylinders 3 from the holding station 17 to each of the etching stations 18, the etch termination station 19, the cleaning stations 20 and 21, and, ultimately, to the storage truck 31.

The conveying means including the hoist 22, overhead tracks 24, and vertically downward extending cylinder receiving means 23 is adaptable in combination with an electrical control circuit to move a plurality of cylinders 3 in sequence from one work station to the next station over a given period of time. That is, in the present example, a plurality of cylinders 3 will be processed at the same time by utilizing an electrical control circuit including a plurality of preset timing devices in combination with integrated circuits including the motor drive 601 (FIG. 6) for the hoist 22 and electrically operated vertically downward extending cylinder receiving means 23.

Figure 2:
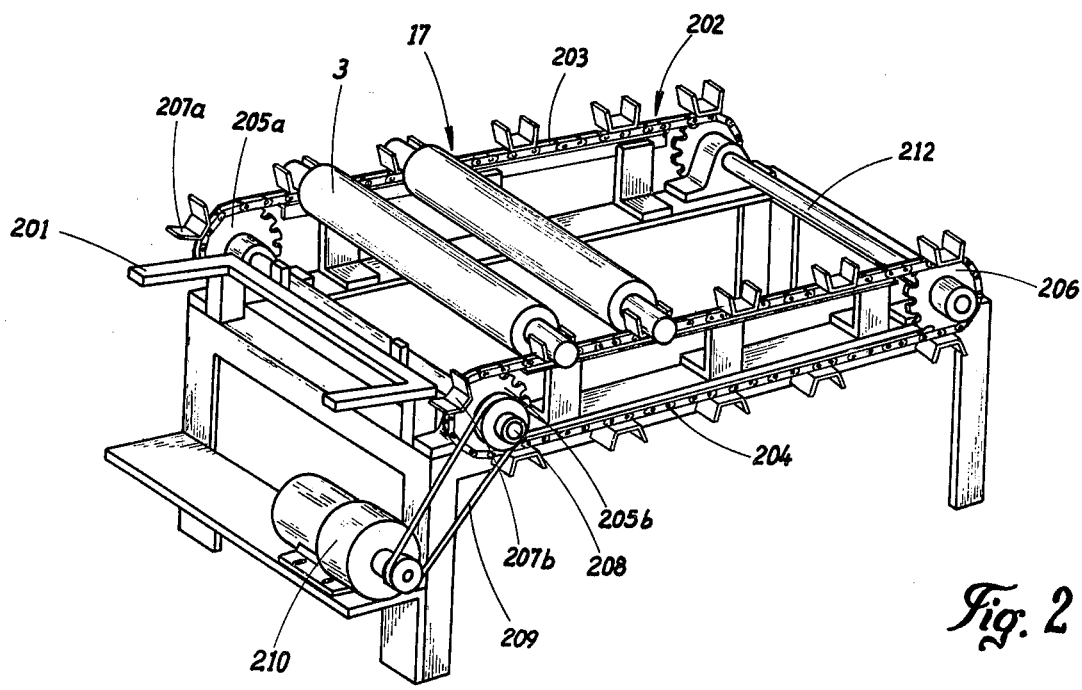
FIG. 2 is a perspective view of one preferred holding station utilized in the method of the present invention.

FIG. 2 illustrating one preferred holding station 17 utilized in the present invention includes a mounting table 201 and a conveyor 202, conveyor 202 including a pair of endless roller chains 203 and 204 which pass around sprockets 205 and 206. Chains 203 and 204 serve to drive the conveyor 202 and support V-shaped cylinder holders 207a and 207b. Sprockets 205a and b are mounted onto a sprocket shaft 208, shaft 208 being driven by sprocket 205b. The sprocket 205b is driven with the endless belt 209 which is in turn driven by a suitable motor drive means 210. At the end of the conveying means 202, opposite motor drive means 210, a shaft 212 is provided, shaft 212 carrying a pair of spaced sprockets 206.

Motor 210 is activated by timing means (not shown) wherein the timing means keeps the motor 210 energized at preselected time intervals. The motor 210 is de-energized in relation to other preselected process times downstream of the holding station, the preselected time during which the motor 210 is energized being determined in accordance with the time it takes to move a V-shaped holder 207 from one position to a second position.

Figure 3:
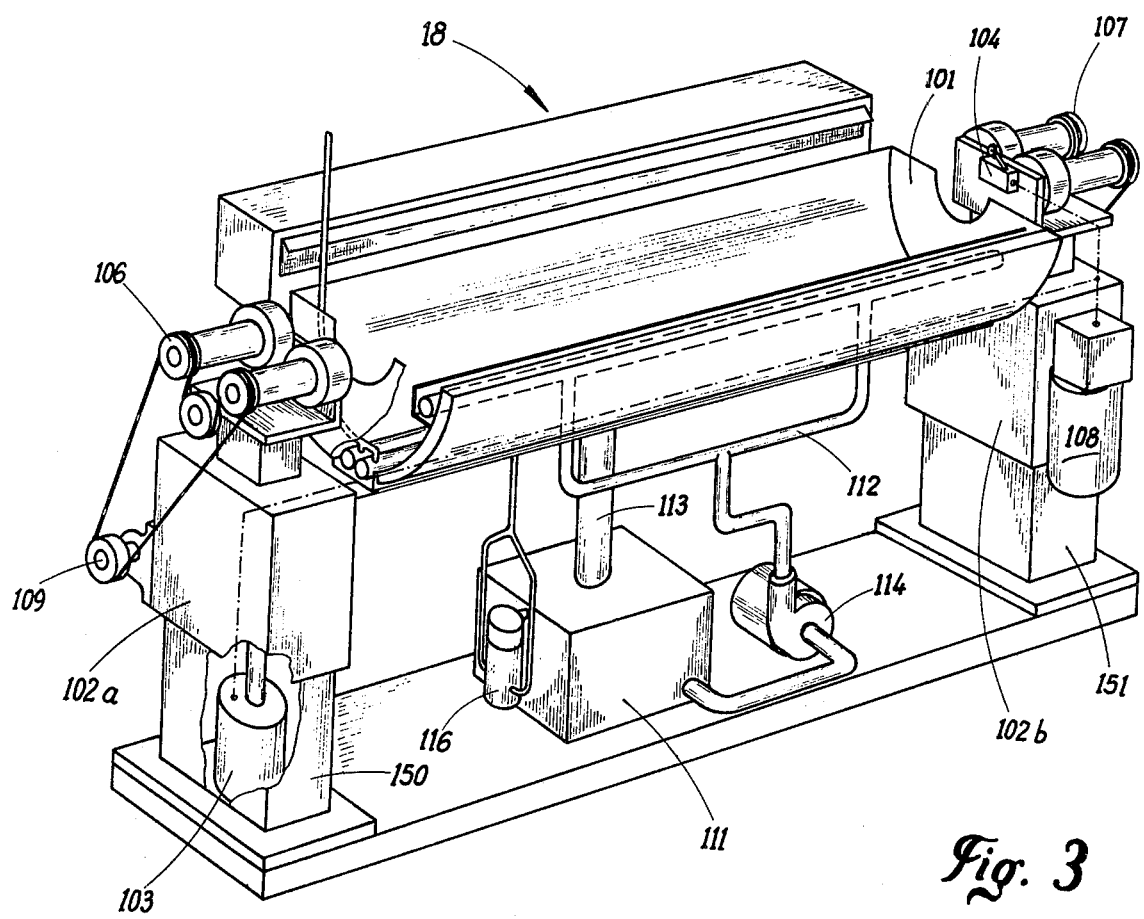
FIG. 3 is a perspective view of one preferred etching station utilized in the method of the present invention.

FIG. 3 illustrating one preferred etching station 18a, b, or c utilized in the present invention includes an etching tray 101 mounted onto fixed support means 150 and 151, and telescoping pedestals 102a and b operated by hydraulic cylinders 103 (only one being shown) for maintaining a positioning relationship between a cylinder 3 and the etching tray 101. The telescoping pedestals 102a and b are operated in response to contact switch 104, switch 104 being activated by placing cylinder 3 upon the driving cylinder rollers 106 and 107 thereby activating pedestals 102a and b. It is also realized that the station may be arranged in such a manner that the tray moves and the pedestals remain stationary. It is further realized that for systems which process cylinders of only one diameter, neither telescoping pedestals nor movable trays are necessary.

A drive means 108 is provided to drive the driving cylinder rollers 107 and is also activated by contact switch 104 upon placing the cylinder 3 upon the rollers 106 and 107. Drive means 108 remains activated as long as contact switch 104 is closed which is until the cylinder 3 is removed from the etching station. It is realized that drive means 108 may be adapted to drive the rollers 107 in either direction or may be adapted to drive the rollers 107 in one direction for a predetermined period of time, then drive the rollers 107 in the opposite direction for another predetermined period of time. A drive shaft 109 driven by drive means 108 is provided for driving rollers 106, as well as the rollers 107.

In order to effect the etching of the cylinder 3, an etchant re-circulating system is provided. The etchant re-circulating system as shown in FIG. 3 includes an etchant holding tank 111 which is in combination with the etching tray 101 by way of supply conduit 112 between the holding tank 111 and the etching tray 101 is a circulating pump 114.

In order to control the etching solution and obtain only the proper amount of etching, a Baume or specific gravity control device, as illustrated at 116 is incorporated. It is realized that any device which will control the concentration of the etching solution may be utilized, the only criteria for the specific gravity control device being that the device will monitor a predetermined concentration and maintain the concentration at a predetermined use condition.

In the preferred embodiment, three etching stations are utilized. Each of these stations are structurally the same, the only difference in these stations being the concentration of the etching solution used in the processing of cylinders 3. It has been found advantageous to utilize three stations, each operating at a different concentration of etching solution in lieu of using only one for most etching resists. But, it is realized that one etching concentration may be used. In using three stations, it is customary to use the highest concentration of etching solution at the first station, such as 18a, for a preselected period of time and use the lowest concentration of etching solution at the last or third station, such as 18c, for substantially the same preselected period of time as for station 18a. In operating in this manner, control of the amount of etching to be done is improved. It is further realized that in the etching operation, a minimum amount of etching solution is lost as the etching solution is used over and over again, only makeup solution being added from time to time to bring the concentration and/or purity up to its preselected condition.

Figure 4:
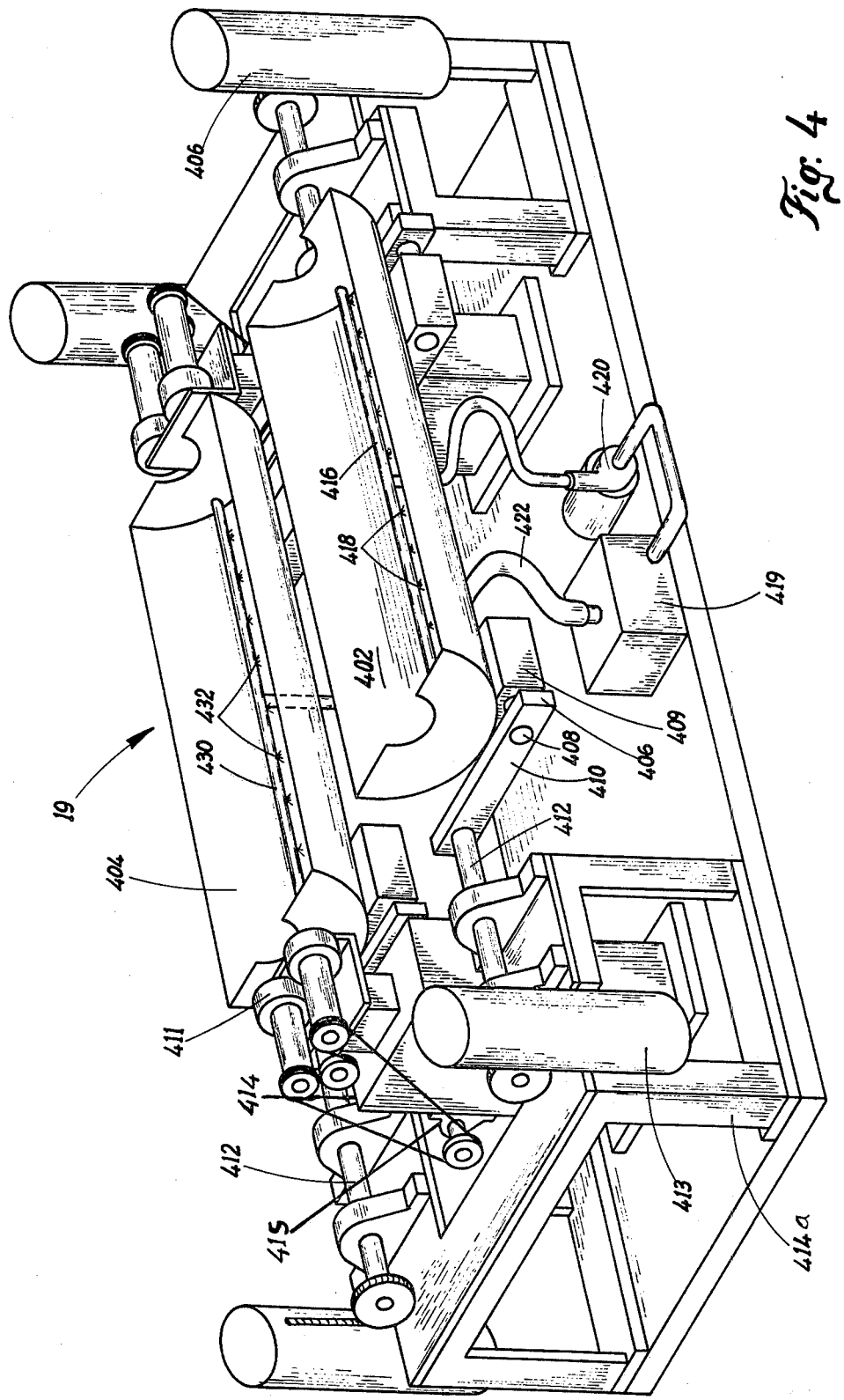
FIG. 4 is a prespective view of one preferred etch terminating station utilized in the method of the present invention.

FIG. 4 illustrating one preferred etch terminating station 19 of the present invention includes a pair of trays 402 and 404. Trays 402 and 404 are attached to a pair of tray shifting devices 406. Tray shifting device 406 includes a longitudinally extending bar 408 rotatably attached to a tray support 409 at one end and rotatably connected to a transversely extending member 410 at the other. Transversely extending member 410 has two apertures therein, the apertures being generally at each end of the member 410 and adaptable for receiving rod member 408 rotatably therein at one end and a longitudinally extending rod member 412 at the other end. Rod member 412 is fixedly attached to the transverse member 410 at one end and is rotatably mounted onto pedestal 414a at the other, pedestal 414 further supporting driving rollers 411 and appropriate motor means 415 for driving rollers 411. Rod member 412 is rotatably operable through gearing and a motor drive 413 in response to electrical circuitry including a manual or automatic device which operates the aforementioned motor drive 413. Upon operation of tray shifting device 406 in one direction, tray 402 is positioned beneath a cylinder 3 which is resting upon rollers 411 and movement thereof in the opposite direction positions tray 404 beneath a cylinder 3.

A horizontally mounted conduit 416 including spray nozzles 418 is mounted transversely of the tray 402. Conduit 416 is in communication with terminating solution tank 419 through pump 420 and discharge conduit 422. Also, horizontally mounted conduit 430 including spray nozzles 432 is mounted transversely of the tray 404. Conduit 430 is in communication with a dilute etching solution system (not shown) which is similar to the etching system previously described in FIG. 3. Tray 404 is utilized to complete the etch, if necessary, prior to shifting tray 402 to terminate the etch.

Figure 5:
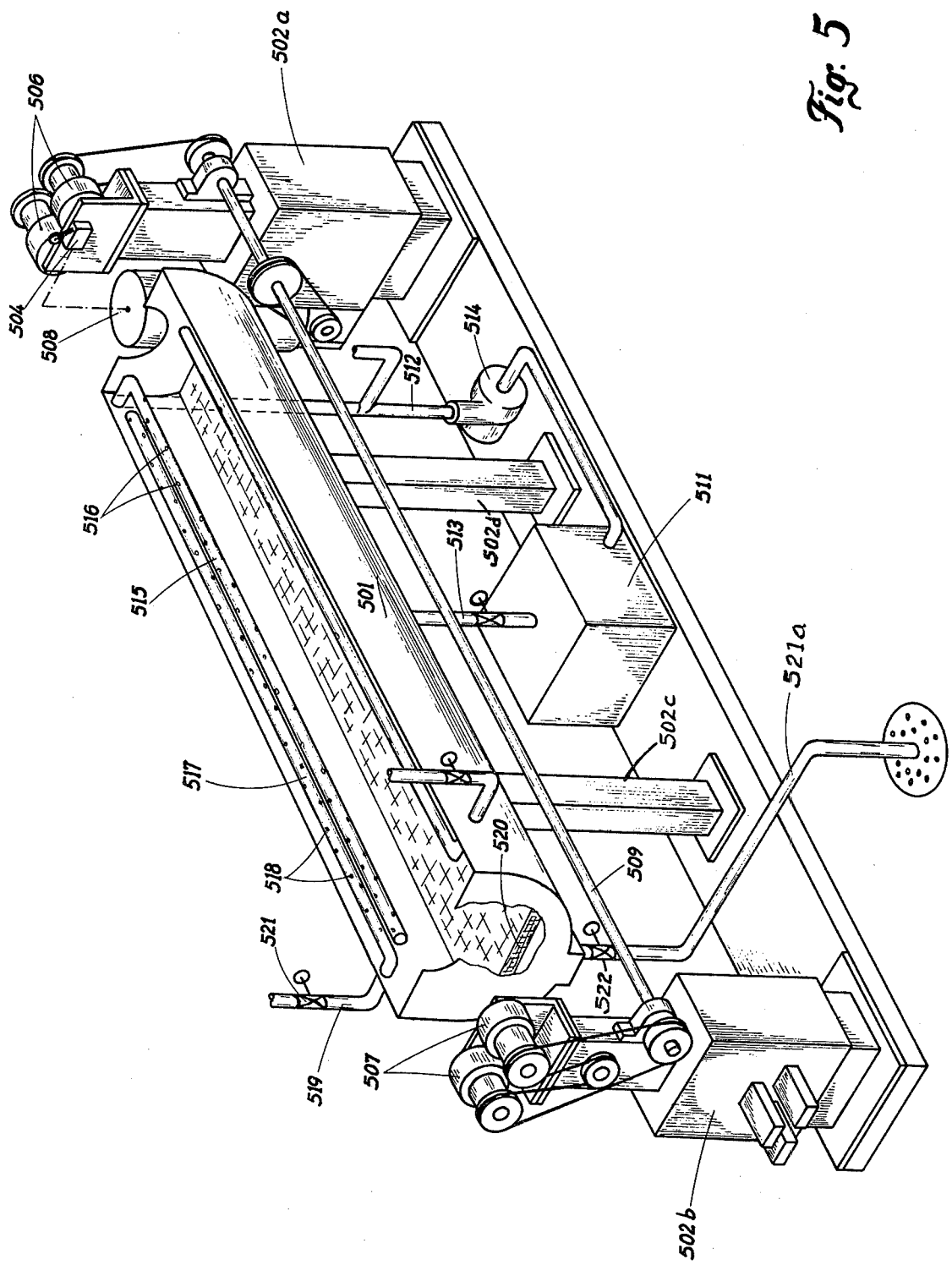
FIG. 5 is a perspective view of one preferred material cleaning station utilized in the method of the present invention; and, FIG. 6 is a perspective view of one preferred conveying means utilized in the method of the present invention.

FIG. 5 illustrating a preferred material cleaning station, two being shown and identified by numerals 20 and 21, of the present invention includes a tray 501 mounted onto a pair of pedestals 502c and d. Driving cylinder rollers 506 and 507 are mounted onto the pedestals 502a and b, respectively, for turning the cylinders when activated. A drive means 508a is provided to drive the driving cylinder rollers 507 and is activated by contact switch 504 upon placing the cylinder 3 upon the rollers 506 and 507. Drive means 508 remains activated as long as contact switch 504 is closed which is until the cylinder 3 is removed from the cleaning station. It is realized that drive means 508 may be adapted to drive the rollers 507 in either direction or may be adapted to drive the rollers 507 in one direction for a predetermined period of time, then drive the rollers 507 in the opposite direction for another predetermined period of time. A drive shaft 509 driven by drive means 508 is provided for driving rollers 506, as well as the rollers 507.

Tray 501 also includes a filter 520 therein for filtering solid material which comes off cylinder 3.

In order to effect the removal of the staging material (station 20), an emulsifying recirculating system is provided. The emulsifying recirculating system as shown in FIG. 5 includes an emulsifyer holder tank 511 which is in communication with the tray 501 by way of supply conduit 512, spraying conduit 515 including spray nozzles 516 therein, and return conduit 513. Included in the supply conduit 512 between the holding tank 511 and the tray 501 is a circulation pump 514. A drain pipe 521a from tray 501 to a drain is also provided when it is desired to discontinue recirculation. A valve 522 is also provided in the drain pipe 521 and may be operated electrically in response to preselected timing devices, if so desired.

Station 20 is further provided with a second spray conduit 517 including spray nozzles 518 therein which is in communication with a water supply conduit 519. A solenoid operated valve 521 is included in supply conduit 519 and operated in response to a timing device (not shown), the timing device also being in electrical communication with the circulating pump 514 wherein emulsifying agent is sprayed onto the cylinder 3 for a preselected period of time then water is sprayed onto the cylinder 3 sequentially for another preselected period of time. The timing device is generally started in response to the activation of contact switch 504 when the cylinder 3 is placed onto pedestal 502a and b, but may be activated in response to some other means. The selection of the cleaning materials and cycle may differ with various staging compositions and are known to those skilled in the art.

In order to effect the removal of a photo-resist material (station 21), a photo-resist removal recirculating system is provided. The photo-resist removal recirculating system as shown in FIG. 5 includes the same system as for station 20, but holding tank 511 includes a photo-resist removal solution instead of an emulsifying agent as discussed previously.

Figure 6:
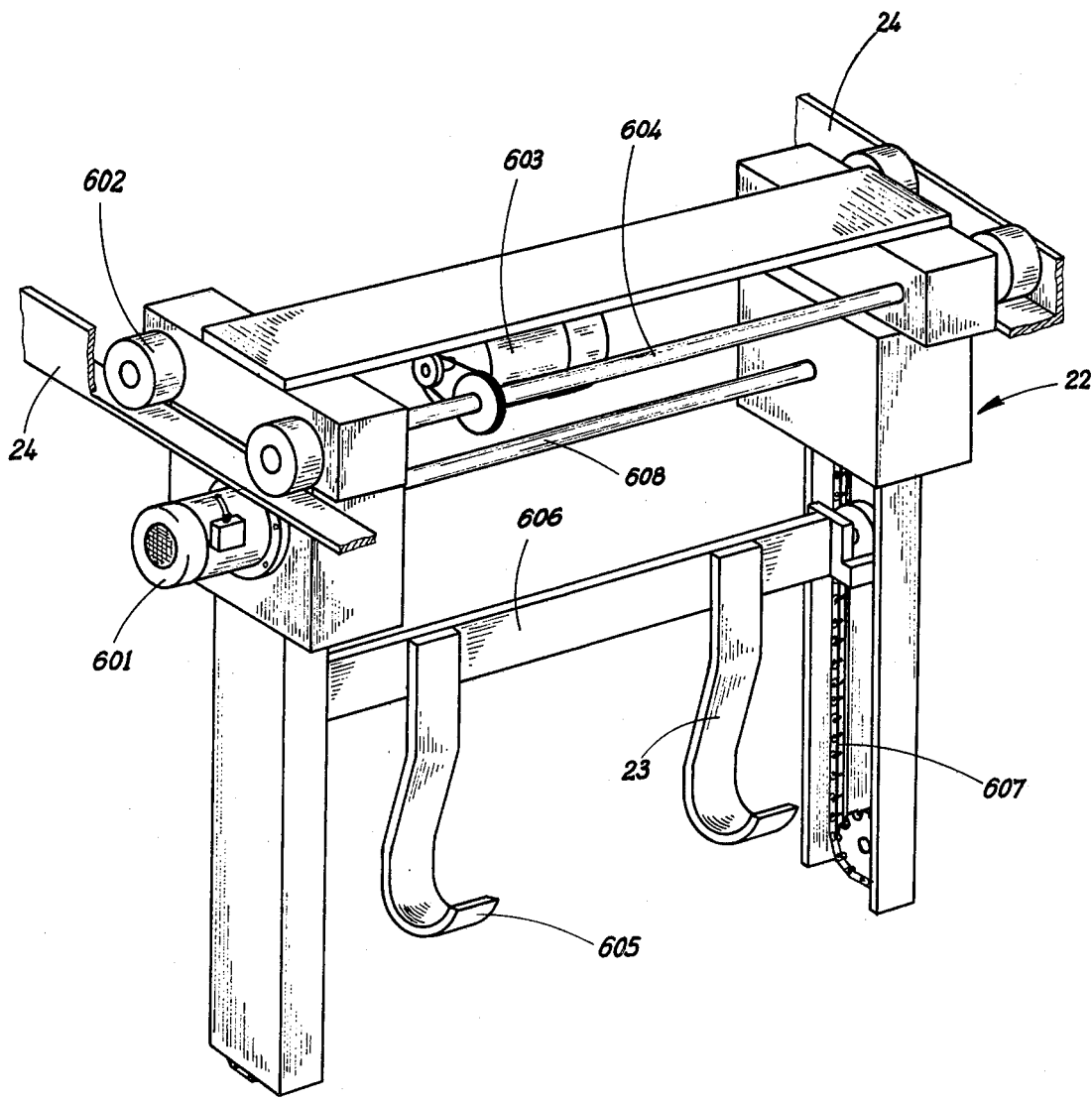

FIG. 6 illustrates a preferred conveying means of the present invention. The conveying means includes a track 24 and a hoist 22 with a vertical downward extending cylinder receiving means 23 mounted thereto. As discussed previously, hoist 22 is in communication with and adapted for horizontal movement along track 24 by means of rollers 602. Rollers 602 are driven by appropriate driving motor means 603 through transversely extending shaft 604. Driving means 603 is adapted for bi-directional movement in response to operation of appropriate circuitry (not shown).

Vertical downward extending cylinder receiving means 23 includes a pair of hooks 605 mounted onto a transversely extending member 606. Member 606 at each extremity is fixedly attached to a vertically extending endless chain 607. Endless chain 607 is driven by driving motor means 601 through transversely extending shaft 608. Driving means 601 is adapted for bi-directional movement in response to operation of appropriate circuitry (not shown). It is realized that other cylinder moving means may be utilized, such as a cable on a drum, without departing from the scope and spirit of the present invention.

In the operation of an apparatus of the present invention, a cylinder 3 is placed onto storage rack 16 for a preselected period of time and is then removed by hoist 22 in combination with cylinder receiving means 23. Hoist 22 is then activated to move to station 17 whereby cylinder receiving means 23 is then activated to place the cylinder 3 in the first holding position. At preselected time intervals, conveyor 202 is activated for a preselected period of time, thereby moving from one holding position to another. At a preselected time period after cylinder 3 has been in the last holding position, hoist 22 is activated for a position over the station 17 and cylinder receiving means 23 is actuated and drops vertically picking up cylinder 3 and in combination with hoist 22 delivers the cylinder 3 to etching station 18a. Cylinder 3 is then lowered onto pedestals 102a and b at station 18a closing normally open pedestal mounted limit switches 104 and 105 (105 not shown). Cylinder 3 begins rotation and circulating pump 114 is then started in response to appropriate circuitry (not shown) which may be either manually or automatically operated. Hoist 22, being activated in response to appropriate relays and timing devices for preselected periods, after a preselected period of time returns to station 18a and lowers cylinder receiving means 23 to pick up cylinder 3 which opens previously closed contact switches 104 and 105. At this point, the circuit is cleared and pedestals 102a and b raise and all operations at station 18a stop. Cylinder 3 is then delivered to station 18b and since station 18b operates in the same manner as 18a, except the acid-etching solution is at a different concentration, further discussion is not necessary.

Hoist 22 is then actuated to return to station 17 and repeat the aforementioned pick up procedure, delivering a new cylinder 3 to station 18a. As soon as the preselected time for the rotation of cylinder 3 at station 18b is complete, hoist 22 is actuated to move over station 18b with cylinder receiving means 23 being lowered to engage with cylinder 3. Hoist 22 is then actuated to move into a position over station 18c wherein cylinder 3 is lowered into place and disengaged from the cylinder receiving means 23 and placed in the rollers 107 of the station 18c. Rotation of cylinder 3 in station 18c is then actuated and since the operation of station 18c is functionally the same as for stations 18a and 18b, the only difference being the concentration of the etching solution, further discussion is not warranted. Hoist 22 is then actuated for a repeat of loading a cylinder 3 onto stations 18b and 18a, as described previously, while cylinder 3 on station 18c is being processed. As soon as the timing device has de-actuated, hoist 22 is then actuated to move over station 18c with cylinder receiving means 23 being actuated vertically downward to engage with cylinder 3.

Hoist 22 is then actuated to move into a position over etch terminating station 19 wherein cylinder receiving means 23 places cylinder 3 onto the rollers 411 for station 19. Rotation of cylinder 3 in station 19 is then started with the tray 402 being actuated to move into a position beneath the cylinder 3. A pump (not shown) is actuated when tray 402 is in position, and the etching solution is sprayed onto cylinder 3 from conduit 430 for a preselected period of time. As soon as the preselected spraying time has been completed, tray 402 is actuated to shift from beneath the cylinder 3 and the tray 404, simultaneously therewith, is positioned beneath cylinder 3. Pump 420 is actuated when tray 404 is in position, and the etch terminating solution is sprayed onto cylinder 3 from conduit 416 for a preselected period of time.

During the operation of station 19, hoist 22 is actuated for repeat of loading cylinders 3 onto station 18c, 18b, and 18a, as described previously.

As soon as the timing device has de-actuated, the circuit operating the motorized cylinder rollers 411 on station 19, hoist 22 is then actuated to move over station 19 with cylinder receiving means 23 being actuated vertically downward to engage with cylinder 3. Hoist 22 is then actuated to move into a position over staging material cleaning station 20 wherein cylinder receiving means 23 places cylinder 3 onto the rollers 506 and 507 for station 20. Rotation of cylinder 3 in station 20 is then started and simultaneously therewith emulsifying circulation pump 514 is actuated and emulsifying solution is sprayed onto cylinder 3 through spraying conduit 515. Spraying continues for a preselected period of time and when the preselected period of time has elapsed, pump 514 is de-energized and solenoid operated valve 521 is actuated to an open position and water is sprayed onto cylinder 3 through conduit 519. Valve 521 is open for a preselected period of time and is then actuated to a closed position thereby discontinuing the water spray onto cylinder 3.

During the operation of station 20, hoist 22 is actuated for a repeat of moving cylinders from stations 18c to 19, 18b to 18c, 18a to 18b, and from station 17 to 18a, as described previously.

As soon as the solenoid valve 521 has returned to its normally closed position, hoist 22 is then actuated to move over station 20 with cylinder receiving means 23 being actuated vertically downward to engage with cylinder 3. Hoist 22 is then actuated to move into a position over photo-resist cleaning station 21 wherein cylinder receiving means 23 places cylinder 3 onto driving cylinder rollers 506 and 507. Rotation of cylinder 3 in station 21 is then started and simultaneously therewith circulating pump 514 is actuated and cleaning solution is sprayed onto cylinder 3 through conduit 515. Spraying continues for a preselected period of time and when the preselected period of time has elapsed, pump 514 is de-energized and solenoid operating valve 521 is actuated to an open position and water is sprayed onto cylinder 3 through conduit 519. Valve 521 is open for a preselected period of time and is then actuated to a closed position thereby discontinuing the water spray onto cylinder 3.

During the operation of station 21, hoist 22 is actuated for a repeat of moving cylinders 3 from stations 19 to 20, 18c to 19, 18b to 18c, 18a to 18b, and from station 17 to 18a, as described previously.

As soon as the solenoid valve 521 has returned to its normally closed position, hoist 22 is then actuated to move over station 21 with cylinder receiving means 23 being actuated vertically downward to engage with cylinder 3. Hoist 22 is then actuated to move into a position over truck 31 or some other transferring means thereby removing the cylinder 3 from the automatic processing apparatus.

As soon as the cylinder 3 has been placed on truck 31, hoist 22 is actuated for a repeat of moving cylinders from stations 20 to 21, 19 to 20, 18c to 19, 18b to 18c, 18a to 18b, and from station 17 to 18a, as described previously.

It is realized that in the actuation of the various parts of the apparatus of the present invention, a plurality of integrated circuits including timing devices, relays and the like may be utilized in order to facilitate the operation of the stated parts. These may be manually or automatically operated or the operations may be performed by a combination thereof.

It is also realized that various changes may be made to the specific embodiment shown and described without departing from the principles of the present invention.

What is claimed is:

1. A method for processing photogravure curvilinear surfaces comprising the steps of:
    placing a first photogravure curvilinear surface onto an etching station;
    rotating said first surface and simultaneously therewith spraying an etching solution thereon for a preselected period of time;

removing said first surface from said etching station, then placing said first surface onto an etch terminating station;

rotating said first surface and simultaneously therewith spraying an etch terminating solution thereon for a preselected period of time; and, removing said first surface from said etch terminating station, the time of residence of said surface at each of said stations being generally the same thereby prompting the sequential continuous movement of surfaces from station to station.

2. The method of claim 1 including placing a second photogravure curvilinear surface onto said etching station after removing said first surface from said etching station; rotating said second surface and simultaneously therewith spraying an etching solution thereon for a preselected period of time; removing said second surface from said etching station after removing said first surface from said etch terminating station, then placing said second surface onto said etch terminating station; rotating said second surface and simultaneously therewith spraying an etch terminating solution thereon for a preselected period of time; and, removing said second surface from said etch terminating station.

3. The method of claim 1 wherein said etching station includes a plurality of stations.

4. The method of claim 1 including the placing of photogravure curvilinear surfaces in sequence upon said etching station subsequently with the removing of said first photogravure curvilinear surface, said photogravure curvilinear surfaces in sequence following simultaneously the steps of said first curvilinear surface.

5. The method of claim 4 wherein said etching station includes a plurality of etching stations.

6. The method of claim 5 wherein said photogravure curvilinear surfaces are on each of said etching stations and said etch terminating station for substantially the same length of time.

* * * * *